United States Patent
An et al.

[11] Patent Number: 6,107,667
[45] Date of Patent: *Aug. 22, 2000

[54] MOS TRANSISTOR WITH LOW-K SPACER TO SUPPRESS CAPACITIVE COUPLING BETWEEN GATE AND SOURCE/DRAIN EXTENSIONS

[75] Inventors: Judy Xilin An, San Jose; Bin Yu, Fremont; Yowjuang W. Liu, San Jose, all of Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/151,146

[22] Filed: Sep. 10, 1998

[51] Int. Cl.$^7$ .......................... H01L 29/76; H01L 29/94; H01L 31/062; H01L 27/088; H01L 27/095

[52] U.S. Cl. .......................... 257/408; 257/382; 257/410; 257/900

[58] Field of Search ...................... 257/380–384, 257/410–412, 345, 401–408, 506, 900; 438/282–289, 299–305, 228

[56] References Cited

U.S. PATENT DOCUMENTS

| | | | |
|---|---|---|---|
| 5,134,451 | 7/1992 | Katoh | 257/384 |
| 5,292,673 | 3/1994 | Shinriki et al. | 438/287 |
| 5,376,578 | 12/1994 | Hsu et al. | 438/289 |
| 5,554,544 | 9/1996 | Hsu | 257/345 |
| 5,559,049 | 9/1996 | Cho | 438/283 |
| 5,731,239 | 3/1998 | Wong et al. | 438/296 |
| 5,734,185 | 3/1998 | Iguchi et al. | 257/408 |
| 5,811,864 | 9/1998 | Butler | 257/401 |

*Primary Examiner*—Minh Loan Tran
*Assistant Examiner*—Cuong Q Nguyen
*Attorney, Agent, or Firm*—Lariviere, Grubman & Payne, LLP

[57] ABSTRACT

A method for making a ULSI MOSFET includes establishing a void in a field oxide layer on a silicon substrate and filling the center of the void with a gate electrode. A high-k gate insulator is sandwiched between the gate electrode and the substrate. Around the void, a low-k gate spacer is formed, with the gate spacer being disposed directly above the source and drain extensions of the MOSFET.

6 Claims, 4 Drawing Sheets

MOS TRANSISTOR WITH LOW-K SPACER TO SUPPRESS CAPACITIVE COUPLING BETWEEN GATE AND SOURCE/DRAIN EXTENSIONS

TECHNICAL FIELD

The present invention relates generally to semiconductor fabrication, and more particularly to methods for fabricating improved ultra-large scale integration (ULSI) semiconductor devices such as ULSI metal oxide silicon field effect transistors (MOSFETs).

BACKGROUND OF THE INVENTION

Semiconductor chips or wafers are used in many applications, including as processor chips for computers, and as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

A common circuit component of semiconductor chips is the transistor. In ULSI semiconductor chips, a transistor is established by forming a polysilicon gate on a silicon substrate, and then forming a source region and a drain region side by side in the substrate beneath the gate by implanting appropriate dopant materials into the areas of the substrate that are to become the source and drain regions. The gate is insulated from the source and drain regions by a thin gate oxide layer. This generally-described structure cooperates to function as a transistor.

To facilitate cooperation between the gate and the source and drain regions, most of the source and drain regions do not lie directly under the gate. However, a small part of the source region does overlap the gate, and likewise a small part of the drain region extends directly under the gate. These small parts of the source and drain regions that overlap the gate are respectively referred to as the source and drain extensions.

While the present invention understands that such extensions enhance the coupling between the gate and the channel that is established by the source and drain regions, the present invention also understands that so-called "fringe" capacitive coupling is induced between the gate and the source/drain extensions. As recognized herein, such fringe coupling degrades the performance of the transistor in alternating current (AC) applications. The importance of this consideration grows as the size of the transistors is reduced by ULSI technology, because while the overall dimensions of the transistors are smaller, the amount by which the source/drain extensions overlap the gate have heretofore remained unchanged. Accordingly, the undesirable effects of fringe capacitive coupling between the gate and the source/drain extensions are magnified in very small transistors.

Moreover, owing to the very small thickness of the insulating gate oxide layer between the gate and the source/drain extension regions, and the relatively high electric field across the gate oxide layer, charge carriers undesirably can tunnel across the gate oxide layer. This renders the transistor "leaky", degrading its performance. To alleviate this problem, high-k dielectrics (dielectrics that have high dielectric constants) are used as the gate insulator, but these materials cause increased fringe coupling. Accordingly, the present invention understands that it is desirable to minimize the overlap between the gate of a transistor and the source/drain extension regions of the transistor.

One approach to the above-noted problem would be to simply space apart the source and drain regions from each other and, hence, reduce the overlap between the source/drain extensions and the gate. This could be done by forming the gate, then forming spacers on the side of the gate, and then implanting dopant into the substrate to establish the source and drain, with the spacers blocking the implantation of dopant in the substrate near the sides of the gate. As recognized herein, however, a drawback of such a process is that the channel length would be enlarged. An enlarged channel length in turn would reduce the transistor drive current and thereby reduce the speed of operation of the circuit.

BRIEF SUMMARY OF THE INVENTION

A method is disclosed for forming one or more field effect transistors (FET) on at least one semiconductor substrate. In accordance with present principles, at least one field oxide layer is formed on the substrate, and at least one gate void is formed in the field oxide layer. The gate void defines at least one wall, and a gate electrode is deposited in the gate void and spaced from the wall of the void. Also, a low-k gate spacer is disposed between the wall and the gate electrode, to reduce unwanted fringe coupling between the gate electrode and source/drain extensions.

In a preferred embodiment, source and drain regions having respective source and drain extensions extending under the gate spacer are established in the substrate. A high-k gate insulator is disposed between the gate electrode and the substrate. As envisioned by the present invention, the gate insulator is characterized by a high dielectric constant and the gate spacer is characterized by a low dielectric constant. If desired, an electrode cap can be disposed over the gate electrode and gate spacer.

To form the gate void, the method first forms a gate oxide layer on the substrate, and then forms a gate polysilicon on the gate oxide. Next, the field oxide layer is established around the gate polysilicon, and the gate polysilicon then removed, forming the gate void.

Further details of the present method include forming a polysilicon spacer in the gate void. After formation and etch-back, the polysilicon spacer does not fill the void, but rather covers only an extension portion of the gate oxide layer. Accordingly,, the polysilicon spacer does not cover a channel portion of the gate oxide layer. The channel portion of the gate oxide layer is removed, and then the high-k gate insulator is deposited between the extension portion of the gate oxide layer. Next, the polysilicon spacer and extension portion of the gate oxide layer are removed, prior to depositing the gate spacer in the gate void. With this combination, the gate spacer extends substantially to the substrate. A semiconductor device made in accordance with the method, and a digital processing apparatus incorporating the semiconductor device, are also disclosed.

In another aspect, a method for making a semiconductor device includes establishing a gate void defining a wall above the substrate, and disposing a gate spacer in the gate void against the wall. The gate spacer is characterized by a low dielectric constant. The method also includes disposing a gate electrode in the gate void such that the gate spacer is disposed between the wall and the gate electrode, and a gate insulator, preferably having a high dielectric constant, is disposed between the gate electrode and the substrate.

In still another aspect, a semiconductor device includes at least one field effect transistor (FET) defining a gate disposed above a silicon substrate. Source and drain regions, including source and drain extensions separated from each other by a substantially undoped channel region, are established in the silicon substrate. A low-k gate spacer is disposed above the extensions and a high-k gate insulator is disposed above the channel region, below a gate electrode.

Other features of the present invention are disclosed or apparent in the section entitled "DETAILED DESCRIPTION OF THE INVENTION".

DETAILED DESCRIPTION OF THE INVENTION

Figure 1:
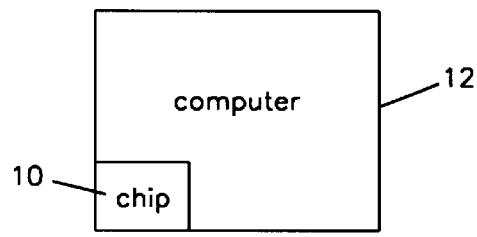
FIG. 1 is a schematic diagram of a semiconductor device made according to the present invention, shown in combination with a digital processing apparatus.

Referring initially to FIG. 1, a semiconductor device embodied as a chip 10 is shown incorporated into a digital processing apparatus such as a computer 12. The chip 10 is made in accordance with the below disclosure.

Figure 2:
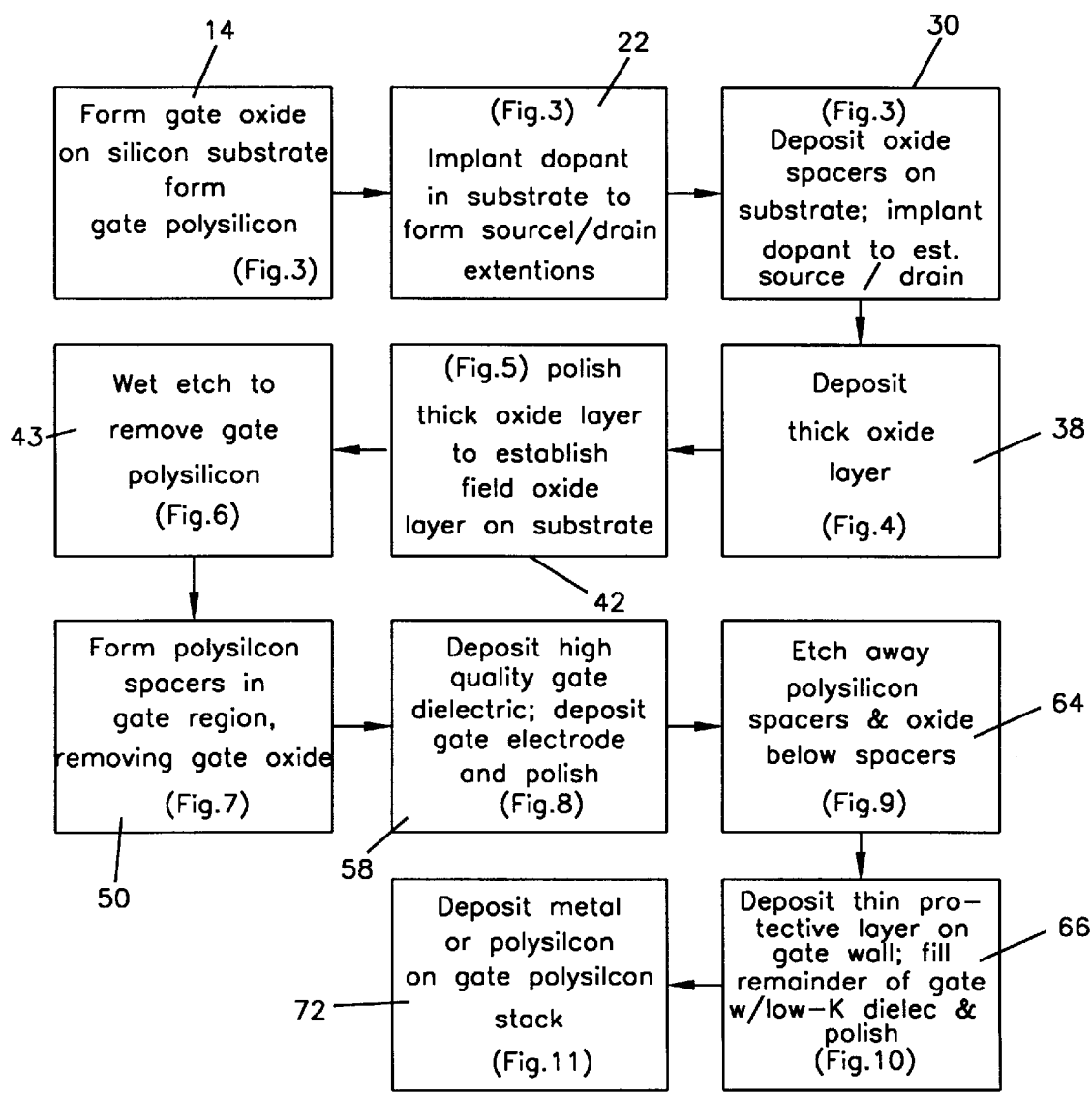
FIG. 2 is a flow chart showing the steps of the present invention.
Figure 3:
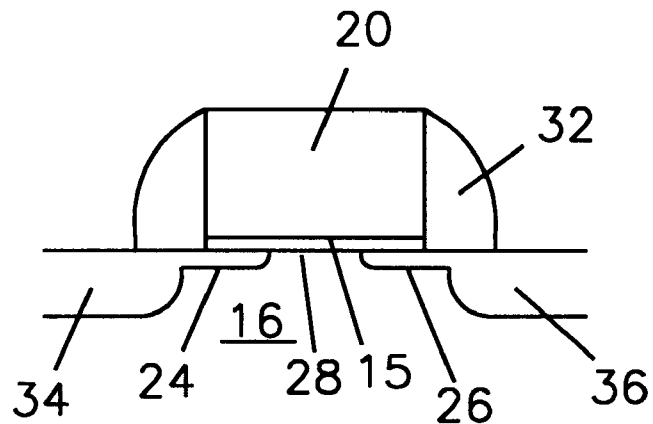
FIG. 3 is a schematic side view of the device after the gate polysilicon, gate oxide, and source/drain regions with extensions have been formed.

Now referring to FIGS. 2 and 3, as indicated at block 14 in FIG. 2 and as shown in FIG. 3, using conventional semiconductor fabrication techniques a gate oxide layer 15 is deposited on a semiconductor substrate 16. Next, a gate polysilicon 20 is formed above the oxide layer 15.

Moving to block 22 of FIG. 2 and still referring to FIG. 3, appropriate dopant materials are implanted into the substrate 16 by conventional means to establish source and drain region extensions 24, 26 that extend directly under the gate polysilicon 20. As further shown in FIG. 3, the source and drain extensions 24, 26 are separated from each other by a substantially undoped channel region 28 in the substrate 16.

Proceeding to block 30 in FIG. 2 and in continued reference to FIG. 3, sidewall oxide spacers 32 are formed on the substrate 16 next to the gate polysilicon 20 in accordance with principles known in the art. Then, the formation of source and drain regions 34, 36, which was started by forming the extensions 24, 26, is completed by implanting dopant as appropriate into the regions 34, 36.

Figure 4:
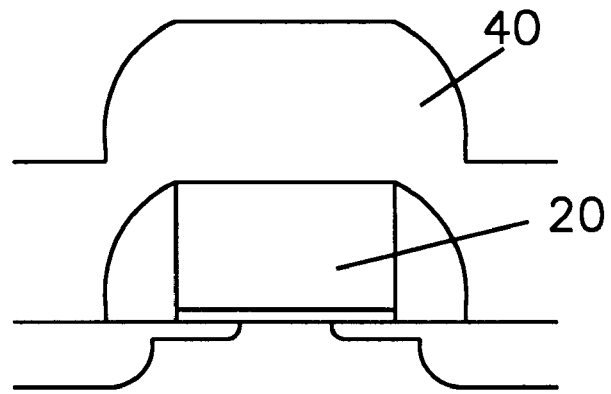
FIG. 4 is a schematic side view of the device after thick field oxide deposition.
Figure 5:
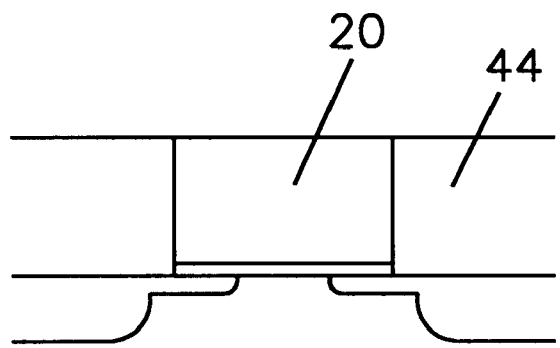
FIG. 5 is a schematic side view of the device after chemical-mechanical polishing (CMP)

Proceeding to block 38 in FIG. 2 and now referring to FIG. 4, a thick oxide layer 40 is deposited over the above-described structure. As indicated at block 42 in FIG. 2 and as shown in FIG. 5, the oxide layer 40 is partially removed by, e.g., chemical mechanical polishing (CMP) such that the top of the oxide layer 40 is flush with the top of the gate polysilicon 20, to thereby establish a field oxide layer 44 on the substrate 16 for well-understood component insulation purposes.

Figure 6:
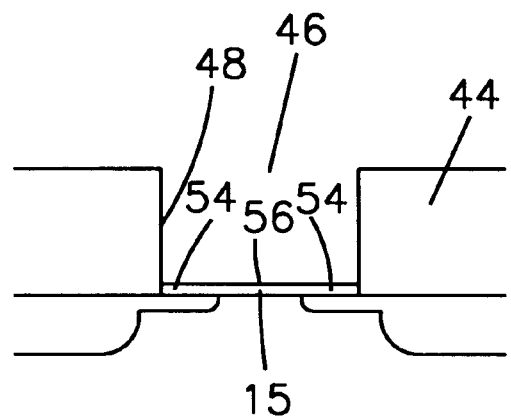
FIG. 6 is a schematic side view of the device after etching away of the gate polysilicon.

Those skilled in the art will recognize that the above-described steps are fabrication processes used for making semiconductor devices in accordance with low pressure chemical vapor deposition (LPCVD) principles. Moving to block 43 of FIG. 2 and now referring to FIG. 6, however, the present invention envisions removing the gate polysilicon 20 using high selectivity wet etching, to render the structure shown in FIG. 6 in which a gate void 46 having wall 48 is established above the gate oxide 15. As shown, the gate oxide 15 remains after the selective wet etch.

Figure 7:
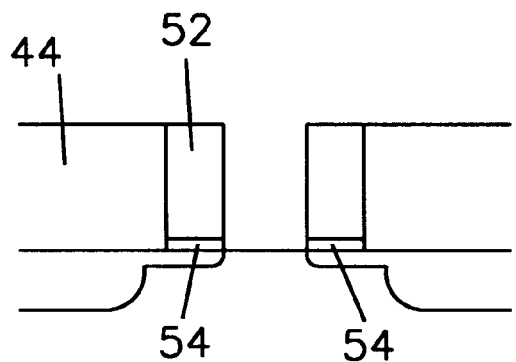
FIG. 7 is a schematic side view of the device after formation of the polysilicon spacers in the gate void and removal of the portions of the gate oxide layer not protected by the spacers.

Proceeding to block 50 in FIG. 2 and now referring to FIG. 7, a spacer material, preferably polysilicon, is deposited in the gate void 46 and then etched back to establish a polysilicon spacer 52. As shown in FIG. 7, the spacer 52 is adjacent the wall 48. Also, in brief cross-reference to FIGS. 6 and 7, the spacer 52 covers only extension portions 54 of the gate oxide 15 (i.e., the portions of the gate oxide 15 that are disposed directly above the source and drain extensions 24, 26), and the spacer 52 does not cover a channel portion 56 of the gate oxide 15 (i.e., the portion of the gate oxide 15 that is disposed directly above the channel region 28). Accordingly, during etch back of the polysilicon spacer 52, the channel portion 56 of the gate oxide 15 is removed, and the silicon thereby exposed can be cleaned if desired with a controlled wet etch. Per the present invention, the spacers 52 are configured as appropriate to establish the desired gate length.

Figure 8:
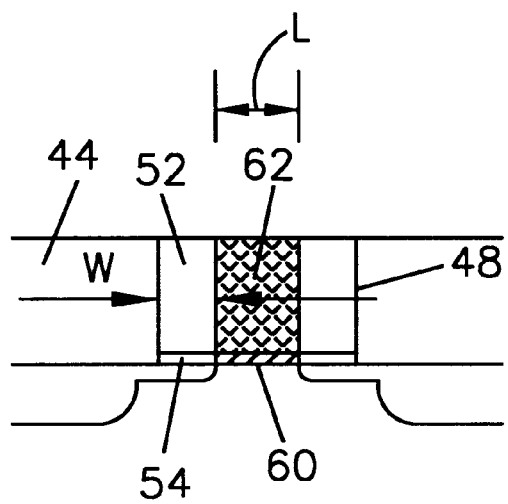
FIG. 8 is a schematic side view of the device after the gate insulator has been regrown and the gate electrode deposited.

Next, as indicated at block 58 of FIG. 2 and as shown in FIG. 8, a gate insulator 60 is deposited between the extension portions 54 of the gate oxide 15. In accordance with the present invention, the gate insulator 60 is characterized by a high dielectric coefficient "k", preferably with k>25.

Following deposition of the gate insulator 60, a gate electrode 62 is formed on the gate insulator 60, substantially filling the annular void within the polysilicon spacer 52. It will be readily recognized that owing to the polysilicon spacer 52, the gate electrode 62 is spaced from the wall 48. The gate electrode can be, e.g., doped polysilicon, tungsten, or titanium nitride (TiN).

Figure 9:
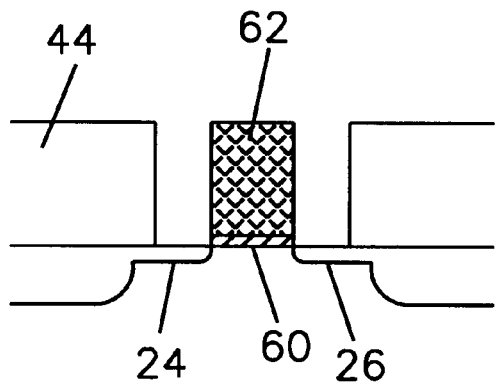
FIG. 9 is a schematic side view of the device after removal of the polysilicon spacers.
Figure 10:
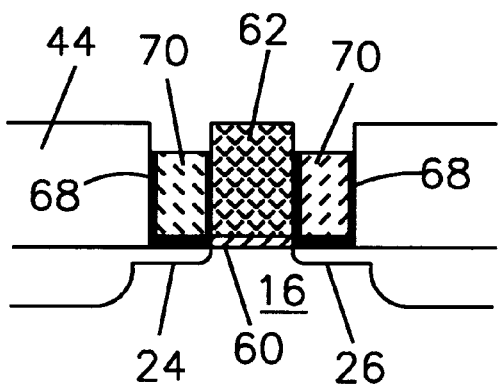
FIG. 10 is a schematic side view of the device after deposition of the low-k dielectric next to the gate polysilicon.

Block 64 indicates and FIG. 9 shows that the polysilicon spacer 52 is next removed by selective etching, along with the extension portions 54 of the gate oxide 15. Then, as indicated at block 66 and shown in FIG. 10, a thin protective oxide or nitride layer 68 is deposited on the wall 48 and the exposed sidewall of the gate electrode 62 to protect the wall 48 and gate electrode 62 from contamination during subsequent steps.

Following deposition of the protective layer 68, a gate spacer 70 is deposited between the layer 68 and the gate electrode 62. With this structure, the gate spacer 70 is disposed directly above the source and drain extensions 24, 26, such that the extensions 24, 26 substantially do not extend directly beneath the gate electrode 62, but extend only under the gate spacer 70. This reduces subsequent fringe coupling between the gate electrode 62 and the source and drain extensions 24, 26. Also, it may now be appreciated that owing to the spacers 52, the gate electrode 62 is spaced from the wall 48, with the length "L" (FIG. 8) of the gate electrode 62 being precisely established by appropriately configuring the spacers 52, and in particular by precisely establishing the widths "W" of the spacers 52.

Figure 11:
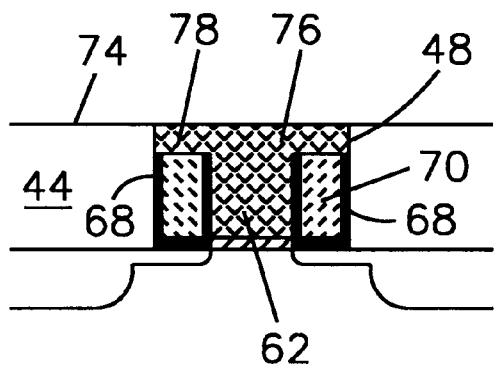
FIG. 11 is a schematic side view of the device after deposition of polysilicon over the gate polysilicon and low-k dielectric, forming a T-shaped gate electrode.

Per the present invention, the gate spacer 70 is characterized by a low dielectric coefficient "k", preferably with k<25. In one preferred embodiment, the gate spacer 70 is made of xerogal or a polymer. As shown, except for the very thin protective layer 68, the gate spacer 70 extends substantially to the substrate 16. The gate spacer 70 is polished down to the gate electrode 62. Then, in cross-reference to FIGS. 10 and 11 and as indicated at block 72 in FIG. 2, both the gate spacer 70 and gate electrode 62 are reduced below the top surface 74 of the field oxide layer 44 to the configuration shown in FIG. 11 by etching. A metal or polysilicon electrode cap 76 is deposited or otherwise disposed over the gate electrode 62 and gate spacer 70, with the top surface 78 of the electrode cap 76 being polished to be substantially flush with the top surface 74 of the field oxide 44 and with the cap 76 extending completely across the void 46 as shown.

It is to be understood that while the disclosure above focusses on a single transistor for clarity of disclosure, the chip 10 can include plural transistors each substantially identical to the transistor shown in described above, as well as other circuit components.

While the particular MOS TRANSISTOR WITH LOW-K SPACER TO SUPPRESS CAPACITIVE COUPLING BETWEEN GATE AND SOURCE/DRAIN EXTENSIONS as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims.

What is claimed is:

1. A semiconductor device made in accordance with the steps comprising of:

establishing a channel region, a source region, a drain region, a source extension and a drain extension within a surface of a substrate;

forming a field oxide layer over the surface of the substrate;

establishing a gate void in the field oxide layer defining a wall above the substrate, wherein the gate void is above the channel region, source extension and drain extension;

forming a gate oxide within the gate void on the surface of the substrate;

disposing a gate spacer in the gate void against the wall over the gate oxide and above the source extension and drain extension, wherein the gate spacer has a void over the channel region of the substrate;

removing the gate oxide above the channel region of the substrate;

placing a gate insulator over the channel region of the substrate in the gate spacer void, wherein the gate insulator has a high dielectric coefficient;

disposing a gate electrode in the gate spacer void so that the gate spacer is disposed between the wall and the gate electrode and the gate insulator is between the gate electrode and the substrate;

removing the gate spacer and gate oxide to form a void between the wall and the gate electrode and exposing the substrate between the wall and the gate insulator;

forming a protective layer in the void between the wall and the gate electrode, so that the protective layer coats the wall, the gate electrode and the substrate between the wall and the gate insulator;

filling part of the void between the wall and the gate electrode with a low dielectric coefficient spacer, so that the low dielectric coefficient spacer is separated from the wall and the substrate and at least part of the gate electrode by the protective layer.

2. A digital processing apparatus incorporating the semiconductor device of claim 1.

3. A semiconductor device comprising:

at least one field effect transistor (FET) comprising:

a silicon substrate, comprising a substantially undoped channel region, a source region, a drain region, a source extension, and a drain extension;

a field oxide layer extending over the entire source region and drain region, wherein the field oxide layer is in contact with the silicon substrate, and wherein the field oxide layer has an aperture passing completely through the field oxide layer over the source extension, drain extension, and channel so that the field oxide layer does not extend over the channel, and wherein the field oxide layer has a thickness, and wherein part of the field oxide layer forms a wall surrounding the aperture;

a high-k gate insulator disposed on the substrate above the channel region within the aperture in the field oxide layer and forming a space between the high-k gate insulator and the field oxide layer;

a gate electrode covering the high-k gate insulator within the aperture in the field oxide layer and forming a space between the gate electrode and the field oxide layer;

a protective layer coating the wall of the field oxide layer and the silicon substrate surface, and the gate electrode within the aperture, so that the protective layer coats the silicon substrate surface in the space between the high-k gate insulator and the field oxide layer, above the source and drain extensions; and a low-k gate spacer being disposed within the aperture of the field oxide layer and above the source and drain extensions in the space between the gate electrode and the field oxide layer, so that the field oxide layer does not extend over the low-k gate spacer, and connected to the part of the protective layer coating the wall of the field oxide layer and the part of the protective layer coating the source extension and drain extension of the silicon substrate and the part of the protective layer coating the gate electrode so that the low-k gate spacer is separated from the field oxide layer, the gate electrode, and the silicon substrate by the protective layer.

4. The device of claim 3, further comprising an electrode cap disposed over the gate electrode and gate spacer.

5. The semiconductor device, as recited in claim 3, wherein the protective layer surrounds the low-k spacer on three sides.

6. The semiconductor device, as recited in claim 5, wherein the protective layer is U-shaped.

* * * * *